United States Patent
Zhu (10) Patent No.: US 11,255,914 B2
(45) Date of Patent: Feb. 22, 2022

(54) COLLECTING AND MEASURING METHOD FOR CONDUCT TRANSITION TIME OF DUAL POWER TRANSFER SWITCH AND APPARATUS THEREOF

(71) Applicant: Gong Zhu, Xiamen (CN)

(72) Inventor: Gong Zhu, Xiamen (CN)

( * ) Notice: Subject to any disclaimer, the term of this patent is extended or adjusted under 35 U.S.C. 154(b) by 0 days.

(21) Appl. No.: 17/102,392

(22) Filed: Nov. 23, 2020

(65) Prior Publication Data
US 2021/0373079 A1    Dec. 2, 2021

(30) Foreign Application Priority Data
Jun. 1, 2020  (CN) .......................... 202010481779.9

(51) Int. Cl.
*G01R 31/327*    (2006.01)
*G06F 3/02*    (2006.01)

(52) U.S. Cl.
CPC ....... *G01R 31/3277* (2013.01); *G06F 3/0202* (2013.01)

(58) Field of Classification Search
CPC .......................... G01R 31/3277; G06F 3/0202
See application file for complete search history.

(56) References Cited

U.S. PATENT DOCUMENTS

| | | | |
|---|---|---|---|
| 2012/0235512 A1* | 9/2012 | Siciliano | H01H 11/0062 307/112 |
| 2016/0141822 A1* | 5/2016 | Hijazi | H01R 13/6595 361/679.31 |
| 2019/0013694 A1* | 1/2019 | Ji | H02J 9/061 |

* cited by examiner

*Primary Examiner* — Amit Chatly (57) ABSTRACT

A collecting and measuring method has corresponding a contacts group to a key of a computer keyboard; corresponding a contacts group state to a key state; corresponding a first keys group and a second keys group to a first power contacts group and a second power contacts group respectively; obtaining and storing a first values group and a second values group when the first keys group and the second keys group are closed respectively; calculating a difference value between the second and first values groups; dividing the difference value by the device frequency value to get a time value; and storing the time value. The time value is a conduct transition time value of a corresponding pole.

9 Claims, 6 Drawing Sheets

COLLECTING AND MEASURING METHOD FOR CONDUCT TRANSITION TIME OF DUAL POWER TRANSFER SWITCH AND APPARATUS THEREOF

CROSS-REFERENCE TO RELATED APPLICATIONS

This application claims priority benefit of Chinese Patent Application No. 202010481779.9 filed on 1 Jun. 2020. The above-referenced application is hereby incorporated herein by reference.

BACKGROUND OF THE INVENTION

The invention relates to electric device detections, especially to collecting and measuring methods for conduct transition time of dual power transfer switches.

In the field of power distribution, a dual power transfer switch is necessary switchgear for important power-using place. The dual power transfer switches switch a load side from current failed power side to another normal power side to ensure normal operation of electrical equipment once the current power supply fails. Circuit switching is completed by contact conversion of power transfer switch, therefore, conduct transition time value is one of important parameters reflecting speed of circuit switching. According to the number of poles, dual power transfer switches can be classified into three-pole dual power transfer switch and four-pole dual power transfer switch. One three-pole dual power switch has nine terminals, there are three first terminals for connecting to a first power side, three second terminals for connecting to a second power side, and three third terminals for connecting to a load side. A four-pole dual power transfer switch has twelve terminals, there are four first terminals for connecting to the first power side, four second terminals for connecting to the second power side, and four third terminals for connecting to the load side.

Figure 12:
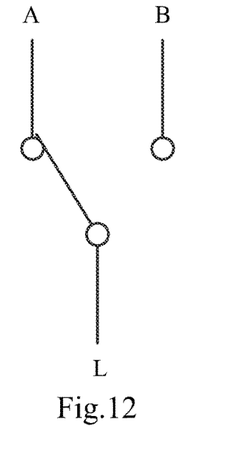
FIG. 12 is a schematic diagram showing a moving contact switching to a first power side.

An example of a contacts group of one pole is shown in FIG. 12, a conduct transition time is a time from when a moving contact is separated from a static contact of a first power side to a time when the moving contact contacts another static contact of the second power side. Therefore, measurement of conduct transition time of contacts group as shown in FIG. 12 is from a moment when the moving contact leaves the static contact of the first power side to a moment when the moving contact contacts the another static contact of the second power side. In this process, ON-OFF conditions of the two power sides are collected, respectively, the first power side and load side change from ON to OFF, the second power side and the load side change from OFF to ON. Therefore, to measure transition time of all contacts of one four-pole dual-power transfer switch when switching circuit at a time, it is necessary to collect ON-OFF conditions of 8 circuits at the same time.

BRIEF SUMMARY OF THE INVENTION

The present invention aims to provide methods for collecting and measuring a conduct transition time of a dual power transfer switch, which are used to collect ON-OFF conditions of a contacts group of the dual power transfer switch when circuit is switched once and to determine the conduct transition time of the switch.

Such object is achieved by providing a method for collecting and measuring a conduct transition time of a dual power transfer switch as defined in claim 1, further advantageous according to the invention will be apparent from the dependent claims.

The present invention provides a method for collecting and measuring a conduct transition time of a dual power transfer switch, the method comprises:

corresponding a contacts group of a dual power transfer switch to a key of a computer keyboard;

corresponding a contacts group state to a key state;

corresponding a first keys group composed of multiple keys to a first power contacts group composed of multiple contacts groups of a first power side;

corresponding a second keys group composed of another multiple keys to a second power contacts group composed of multiple contacts groups of a second power side;

obtaining a device frequency value of a computer;

obtaining and storing a first values group of a counter of the computer when the first keys group is closed, each value of the first values group corresponding to a count value of the counter when a corresponding key of the first keys group is closed;

obtaining and storing a second values group of the counter of the computer when the second keys group is closed, each value of the second values group corresponding to a count value of the counter when a corresponding key of the second keys group is closed;

calculating a difference value between two values of a corresponding pole in the second values group and the first values group;

dividing the difference value by the device frequency value of the computer to get a time value; and storing the time value, the time value being a conduct transition time value of a corresponding pole.

The present invention further provides an apparatus for collecting and measuring a conduct transition time of a dual power transfer switch, the apparatus comprises:

a corresponding unit for corresponding a contacts group of a dual power transfer switch to a key of a computer keyboard, for corresponding a contacts group state to a key state, for corresponding a first keys group composed of multiple keys to a first power contacts group composed of multiple contacts groups of a first power side, and for corresponding a second keys group composed of another multiple keys to a second power contacts group composed of multiple contacts groups of a second power side;

a frequency obtaining unit for obtaining a device frequency value of the computer;

a first count value obtaining unit for obtaining a first values group of a counter of the computer when the first keys group is closed, each value of the first values group corresponding to a count value of the counter when a corresponding key of the first keys group is closed;

a second count value obtaining unit for obtaining a second values group of the counter of the computer when the second keys group is closed, each value of the second values group corresponding to a count value of the counter when a corresponding key of the second keys group is closed;

a first storage unit for storing the first values group;

a second storage unit for storing the second values group;

a third storage unit for storing the device frequency value of the computer;

a computing unit for calculating a difference value between two values of a corresponding pole in the second values group and the first values group, and for dividing the difference value by the device frequency value of the computer to get a time value, the time value being a conduct transition time value of a corresponding pole; and a fourth storage unit for storing the time value.

Advantageous Effects

1. Contacts groups of dual power transfer switch correspond to keys of computer keyboard and contacts group states correspond to key states, the number of keys of one keyboard varies from 61 to 104, therefore, the number of corresponding contacts groups is between 61 and 104. One pole of switch needs 2 keys to correspond to one contacts group, so one four-pole switch needs 8 keys to correspond, therefore, one keyboard can simultaneously collect and measure conduct transition time of 7 to 13 four-pole switches. So efficiency of using the collecting and measuring method or the collecting and measuring apparatus disclosed in the present invention to collect and measure conduct transition time of dual power switch is significantly improved.

2. Since measurement accuracy of collecting and measuring method disclosed in the present invention is based on equipment frequency of computer, current common computer equipment frequency is above 1000000 hz, therefore, using the collecting and measuring method or the collecting and measuring apparatus disclosed in the present invention to measure conduct transition time of dual power transfer switch can obtain microsecond measurement accuracy, measurement accuracy is significantly improved.

3. Obtain and store a first values group of a counter of a computer when a first keys group is closed, so that the computer always collects and stores the current first values group when the contacts remains on a first power side, the first values group comprises count values of contacts group of each pole on the first power side. When a contacts group is disconnected, that is, a moment when the first keys group is disconnected, the computer no longer collects and stores a count value corresponding to each pole. Therefore, the count value stored in a storage unit is a first values group at a moment when the contacts group is disconnected, this first values group accurately reflects count values at a moment when the contacts group of each pole on the first power side is disconnected.

4. Obtain and store a second values group of the counter of the computer when a second keys group is closed, then calculate a difference value between the second values group and the first values group. Set the computing step directly when the second values group is collected, so that when contacts touch a second power side, that is, a moment when the second keys group is closed, the computer collects and stores the second values group of the current counter, each value in this second values group accurately reflects a count value at a moment when a contacts group of a corresponding pole on the second power side is closed, and calculate a difference value between two values of the corresponding poles in the second values group and the first values group. Then divide the difference value by a device frequency value of the computer to get a time value, this time value accurately reflects a conduct transition time value of each pole of a dual power transfer switch.

5. The second values group of the counter is obtained and stored when the second key group is closed according to values of a second auxiliary parameters group. Since the second auxiliary parameters group is set, values of the second values group are obtained based on values of the second auxiliary parameters group, therefore, only when values of the second auxiliary parameters group meets a preset condition, the computer obtains and stores the count value of the counter when the contacts group is closed, it is ensured that the second values group participating in calculation is the count value at a moment of closed or opened of contacts group of each pole.

6. Values of the second auxiliary parameters group are changed after obtaining and storing the second values group, this arrangement makes values of the second auxiliary parameters group change after the computer collects the second values group when the contacts group connects the second power side. Since obtaining of value of the second values group is based on values of the second auxiliary parameters group, after values of the second auxiliary parameters group changes, the computer no longer obtains or stores a count value of the counter when the contacts group is closed. It is ensured that each value of the second values group obtained and stored by the computer is a count value at a moment when each pole contacts group is closed.

7. Calculate a difference value between two values of a corresponding pole in the first values group and the second values group when values of the first auxiliary parameters group, a value of the second position parameter, and a state of the first keys group meet preset conditions, then divide the difference value by the device frequency value of the computer to get a time value, this time value is a conduct transition time value. Such arrangement enables the collecting method or apparatus disclosed in the present invention to not only collect a conduct transition time of a dual power transfer switch from a first power side to a second power side, but also to continue to collect a conduct transition time of the dual power transfer switch from the second power side back to the first power side without changing wiring method between dual power transfer switch terminals and the collecting apparatus. Therefore, the collecting method or apparatus disclosed in the present invention can continuously and uninterruptedly collect and measure conduct transition time of each pole in multiple transition cycles of dual power transfer switch so as to provide basic data for further judging influence of frequent operations on conduct transition time.

BRIEF DESCRIPTION OF THE SEVERAL VIEWS OF THE DRAWINGS

Further characteristics and advantages of the invention will emerge from the description of preferred, non-limiting examples of which are provided in the attached drawings, in which.

DETAILED DESCRIPTION OF THE INVENTION

The description in this application "change or store a certain parameter" means "change or store a value of the corresponding parameter", take "first position parameter" as an example, "change a first position parameter" means "change a value of the first position parameter", "store a first position parameter" means "store a value of the first position parameter".

Figure 13:
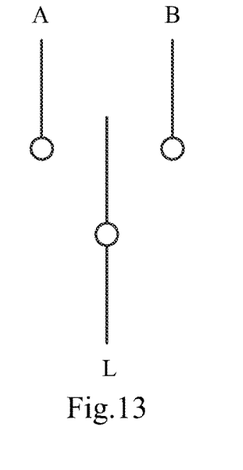
FIG. 13 is a schematic diagram showing a switching process of a moving contact.
Figure 14:
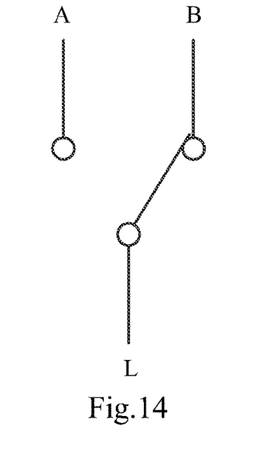
FIG. 14 is a schematic diagram showing a moving contact switching to a second power side.

An example of contacts movement of one pole of a dual power transfer switch is shown in FIGS. 12-14, Terminal A is used for connecting a first power side, terminal B is used for connecting a second power side, terminal L is used for connecting a load side. Referring to FIG. 12, a moving contact is currently on the first power side, the load side and the first power side is in an ON state, the load side and the second power side is in an OFF state, the load side is currently powered by the first power side. Referring to FIG. 13, the moving contact is currently between the first power side and the second power side, the load side and the first power side is in the OFF state, the load side and the second power side is in the OFF state, the load side is not currently powered. Referring to FIG. 14, the moving contact is currently on the second power side, the load side and the first power side is in the OFF state, the load side and the second power side is in the ON state, current the load side is powered by the second power side. Hereby, a contacts group that electrically connects or disconnects the first power side and the load side is defined as a first power contacts group, another contacts group that electrically connects or disconnects the second power side and the load side is defined as a second power contacts group. Therefore, a process of switching the load side from the first power side to the second power side by one of poles of the dual power transfer switch comprises state changes of the two contacts groups. The first power contacts group is switched from a closed state to an opened state and the second power contacts group is switched from the opened state to the closed state, so a four-pole dual power transfer switch has state changes of 8 contacts groups. One transition cycle of the dual power transfer switch is that the load side are switched from the first power side to the second power side and then from the second power side back to the first power side.

Figure 15:
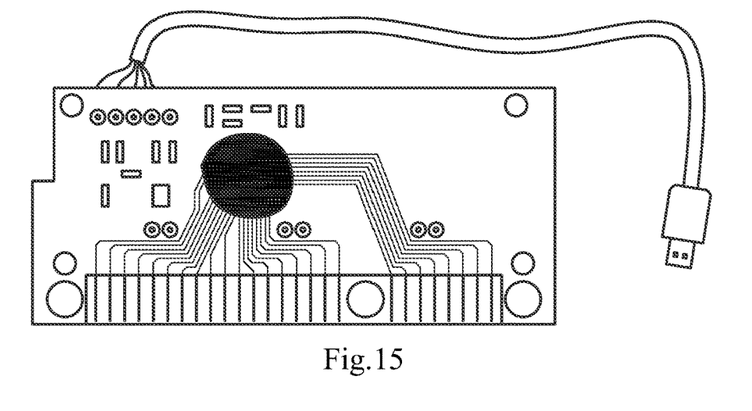
FIG. 15 is a schematic diagram of a circuit board of a computer keyboard.

FIG. 15 is a schematic diagram of a circuit board of a computer keyboard, the circuit board comprises a USB interface or a PS2 interface for connecting to a computer, a signal input terminal for obtaining a closing signal, and an electronic circuit processing unit for processing input and output signals. The signal input terminal comprises multiple contacts arranged in parallel, the computer obtains a character corresponding to a certain key on the keyboard once two of these contacts are electrically connected. Currently, the number of keys on the keyboard ranges from 61 to 104, so the number of corresponding characters is between 61 and 104.

Figure 16:
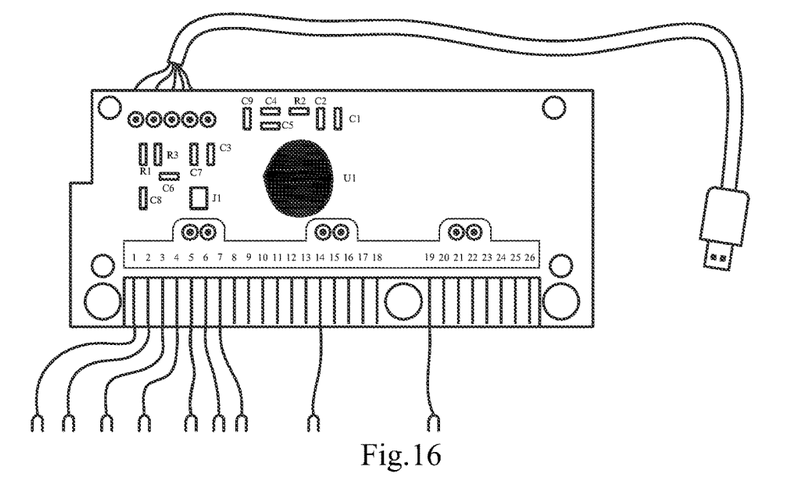
FIG. 16 is a schematic diagram of an illustrative collecting apparatus in accordance with an embodiment of the present invention.

FIG. 16 is a schematic diagram of an illustrative collecting apparatus, the collecting apparatus comprises the circuit board of the computer keyboard, and a collecting terminal electrically connected with the circuit board. The collecting terminal comprises a plurality of collecting lines, the collecting lines are used to electrically connect terminals of the dual power transfer switch. As shown in FIG. 16, the collecting apparatus is used to connect a computer with the dual power transfer switch. Taking one four-pole dual power transfer switch as an example, one collecting end of the collecting apparatus comprises 9 collecting lines, labeled 1-7, 14 and 19 respectively. The computer gets different characters if collecting line 19 is respectively connected with collecting lines 1-7, 14, as shown in Table 1. Among them, collecting lines 1, 3, 5 and 7 are respectively used to electrically connect with phase A, phase B, phase C, and phase N of the first power side, collecting lines 2, 4, 6, and 14 are respectively used to electrically connect with phase A, phase B, phase C, and phase N of the second power side, collecting line 19 is used to electrically connect with the load side, since the collecting line 19 is a common line, it is not necessary to distinguish phases A, B, C and N. Electrically connect all phases of the load side together and then electrically connect with collecting line 19. Comparison relationship among line number, character, phase sequence and power side is shown in Table 1.

Figure 1:
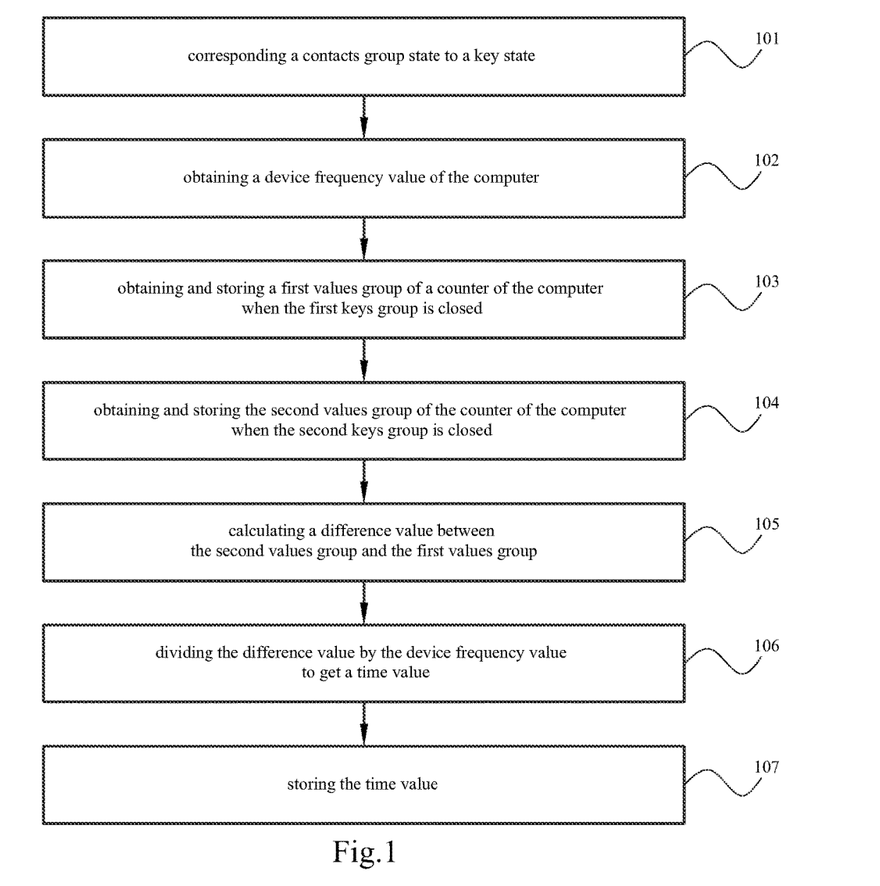
FIG. 1 is a flow chart of illustrative collecting and measuring method for conduct transition time of dual power transfer switch in accordance with an embodiment of the present invention.

FIG. 1 is a flow chart of illustrative collecting and measuring method for conduct transition time of dual power transfer switch, as shown in FIG. 1, the method is used to collect and measure a conduct transition time of dual power transfer switch, take one dual power transfer switch as an example, the collecting and measuring method comprises following steps.

At step 101, corresponding a contacts group of the dual power transfer switch to a key of the computer keyboard; corresponding a contacts group state to a key state; corresponding a first keys group composed of multiple keys to the first power contacts group composed of multiple contacts groups of the first power side; and corresponding a second keys group composed of another multiple keys to the second power contacts group composed of multiple contacts groups of the second power side.

As an exemplary embodiment, the first keys group comprises first key Q, second key E, third key U, and fourth key O. The second keys group comprises fifth key W, sixth key R, seventh key I, and eighth key P. The first power contacts group comprises a first contacts group, a second contacts group, a third contacts group, and a fourth contacts group.

The second power contacts group comprises a fifth contacts group, a sixth contacts group, a seventh contacts group, and an eighth contacts group. Phase A, phase B, phase C, and phase N of the first power side respectively correspond to the first contacts group, the second contacts group, the third contact group, and the fourth group. First key Q, second key E, third key U, and fourth key O respectively correspond to the first contacts group, the second contacts group, the third contact group, and the fourth group. Phase A, phase B, phase C, and phase N of the second power side respectively correspond to the fifth contacts group, the sixth contacts group, the seventh contact group, and the eighth group. fifth key W, sixth key R, seventh key I, and eighth key P respectively correspond to the fifth contacts group, the sixth contacts group, the seventh contact group, and the eighth group. Therefore, the first contacts group and the fifth contacts group correspond to a same pole, the second contacts group and the sixth contacts group correspond to a same pole, the third contacts group and the seventh contacts group correspond to a same pole, the fourth contacts group and the eighth contacts group correspond to a same pole. An opened state of a contacts group corresponds to a reset state of a key of the computer keyboard, a closed state of the contacts group corresponds to a closed state of the key of the computer keyboard. Take one pole of the switch as an example, the computer obtains character Q once the first contacts group is closed, the computer stops obtaining character Q once the first contacts group is opened. The computer obtains character W once the fifth contacts group is closed, the computer stops obtaining character W once the fifth contacts group is opened.

At step 102, obtaining a device frequency value of the computer.

Take programming language C++ as an example, the device frequency value of the computer can be obtained through command "QueryPerformanceFrequency ( )".

At step 103, obtaining and storing a first values group of a counter of the computer when the first keys group is closed, each value of the first values group corresponding to a count value of the counter when a corresponding key of the first keys group is closed.

At step 104, obtaining and storing the second values group of the counter of the computer when the second keys group is closed, each value of the second values group corresponding to a count value of the counter when a corresponding key of the second keys group is closed.

A corresponding count value is calibrated by obtaining a count value of the counter and storing the current count value when current event occurs. Specifically, obtaining a first value of the counter of the computer when first key Q is closed, and storing the first value; obtaining a second value of the counter of the computer when second key E is closed, and storing the second value; obtaining a third value of the counter of the computer when third key U is closed, and storing the third value; obtaining a fourth value of the counter of the computer when fourth key O is closed, and storing the fourth value. A values group composed of the first value, the second value, the third value, and the fourth value is represented as the first values group. Obtaining a fifth value of the counter of the computer when fifth key W is closed, and storing the fifth value; obtaining a sixth value of the counter of the computer when sixth key R is closed, and storing the sixth value; obtaining a seventh value of the counter of the computer when seventh key I is closed, and storing the seventh value; obtaining an eighth value of the counter of the computer when eighth key P is closed, and storing the eighth value. Another values group composed of the fifth value, the sixth value, the seventh value, and the eighth value is represented as the second values group. In a process of the dual power transfer switch switching the load side from the first power side to the second power side, the first power contacts group changes from original closed state to opened state, and the second power contacts group changes from original opened state to closed state. In terms of two keys corresponding to a same pole, fifth key W changes from opened state to closed state after first key Q changes from closed state to opened state, sixth key R changes from opened state to closed state after second key E changes from closed state to opened state, seventh key I changes from opened state to closed state after first key U changes from closed state to opened state, eighth key P changes from opened state to closed state after first key O changes from closed state to opened state.

Take programming language C++ as an example, it can be determined whether a current key is pressed through command "GetAsyncKeyState ( )", that is, it is determined whether first key Q, second key E, third key U, fourth key O, fifth key W, sixth key R, seventh key I, or eighth key P is pressed. Current a counter value can be obtained and stored through command "QueryPerformanceCounter ( )". Therefore, a count value of the counter when each key in the first keys group is closed and another count value of the counter when each key in the second keys group is closed are obtained through command "if (GetAsyncKeyState ( )<0) {QueryPerformanceCounter ( )}", that is, the first values group composed of count values of the counter when each contacts group in the first power contacts group is closed and the second values group composed of count values of the counter when each contacts group in the second power contacts group is closed are obtained.

Since program is executed according to commands, and a value stored in each parameter is replaced by another value currently obtained, the computer will overwrite a count value previously stored with another count value currently obtained when the first contacts group is closed, therefore the first value is updated in real time. The computer no longer obtains or stores a count value when the first contacts group changes from closed state to opened state, therefore, the first value stored is a count value obtained by the computer at a moment when the first contacts group changes from closed to opened, so the first value is real and valid. In the same way, the second value, the third value, and the fourth value are also true and valid, that is, the first values group is true and valid.

At step 105, calculating a difference value between two values of a corresponding pole in the second values group and the first values group.

At step 106, dividing the difference value by the device frequency value of the computer to get a time value.

At step 107, storing the time value, the time value is a conduct transition time value of a corresponding pole.

Subtract a count value obtained when the contacts group in the first power contacts group is opened from a count value obtained when the contacts group of a corresponding pole in the second power contacts group is closed so as to obtain a difference value, divide the difference value by the device frequency value to get a time value. Take phase A of the switch as an example, this time value calibrates a time period from a moment when the first contacts group switches from closed state to opened state to a moment when the fifth contacts group switches from opened state to closed state, that is, the time value truly and effectively reflects a time period from a moment when a moving contact of phase A of the dual power transfer switch leaves a static contact of the first power side to a moment when the moving contact contacts another static contact of the second power side. In the same way, conduct transition time values of phase B, phase C and phase N of the switch can be obtained.

Therefore, a conduct transition time value of each pole of the dual power transfer switch can be obtained in real time once the switch switches the load side from the first power side to the second power side.

Measurement accuracy of collecting and measuring method is based on computer equipment frequency, and current common computer equipment frequency is above 1000000 hz, therefore, using the collecting and measuring method disclosed in the present invention to measure conduct transition time of dual power transfer switch can obtain microsecond measurement accuracy, measurement accuracy is significantly improved. Contacts groups of dual power transfer switch correspond to keys of computer keyboard and contacts group states correspond to key states, the number of keys of one keyboard varies from 61 to 104, therefore, the number of corresponding contacts groups is between 61 and 104. One pole of switch needs 2 keys to correspond to one contacts group, so one four-pole switch needs 8 keys to correspond, Therefore, one keyboard can simultaneously collect and measure conduct transition time of 7 to 13 four-pole switches. So efficiency of using the collecting and measuring method disclosed in the present invention to collect and measure conduct transition time of dual power switch is significantly improved.

Figure 3:
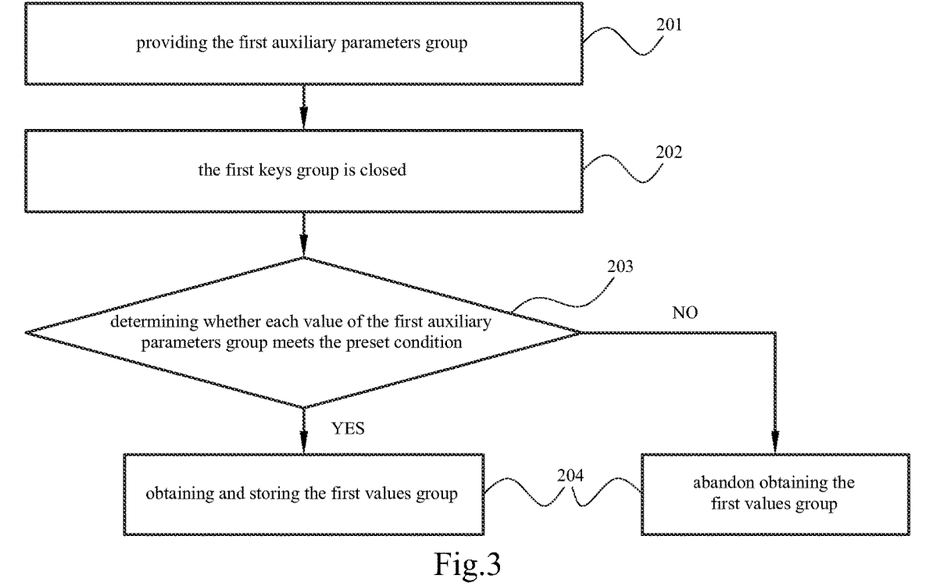
FIG. 3 is a flow chart of illustrative steps for obtaining and storing a first values group in accordance with an embodiment of the present invention.

FIG. 3 is a flow chart of illustrative steps for obtaining and storing the first values group, it is a method used to obtain and store the first values group of the counter of the computer when the first keys group is closed according to a value of a first auxiliary parameters group. As shown in FIG. 3, the method comprises following steps.

At step 201, providing the first auxiliary parameters group.

As an illustrative example, the dual power transfer switch switches the load side from the first power side to the second power side. The first auxiliary parameters group comprises a first auxiliary parameter, a second auxiliary parameter, a third auxiliary parameter, and a fourth auxiliary parameter. Initialize values of all auxiliary parameters in the first auxiliary parameters group to 0 in an early stage of collecting and measuring program. The first auxiliary parameters group is used to assist in execution of command for obtaining the first values group. A preset condition for obtaining the first values group is that each value of the first auxiliary parameters group is 0. Specifically, a command for obtaining the first value is executed once the first auxiliary parameter is 0, another command for obtaining the second value is executed once the second auxiliary parameter is 0, another command for obtaining the third value is executed once the third auxiliary parameter is 0, another command for obtaining the fourth value is executed once the fourth auxiliary parameter is 0.

At step 202, it is detected that the first keys group is pressed.

At step 203, it is determined whether each value of the first auxiliary parameters group meets the preset condition.

At step 204, if each value of the first auxiliary parameters group meets the preset condition, the computer obtains and stores the first values group; if any value of the first auxiliary parameters group does not meet the preset condition, the computer abandons obtaining the first values group.

Determine whether the first auxiliary parameters group meets the preset condition when the first power contacts group of the dual power transfer switch is closed, i.e., first key Q, second key E, third key U, and fourth key O are all closed. Since each value of the first auxiliary parameters group has been initialized to 0, the first auxiliary parameters group satisfies the preset condition, the computer obtains count values of the counter at this time, and stores obtained count values in the first values group. Specifically, obtain and store the first value when the first contacts group corresponding to first key Q is closed according to the first auxiliary parameter, obtain and store the second value when the second contacts group corresponding to first key E is closed according to the second auxiliary parameter, obtain and store the third value when the third contacts group corresponding to first key U is closed according to the third auxiliary parameter, obtain and store the fourth value when the fourth contacts group corresponding to first key O is closed according to the fourth auxiliary parameter.

The first power contacts group and the second power contacts group maintain their current positions before the dual power transfer switch is switched, so the first power contacts group is kept closed, therefore, the computer continuously obtains current count value of the counter and stores it in the first values group, thus, after the first power contact group is closed, each value in the first values group is continuously updated in real time under a condition that each value of the first auxiliary parameters group is 0. When the first power contacts group remains closed, and each value of the first auxiliary parameters group is other numbers other than 0, that is, each value of the first auxiliary parameters group does not meet the preset condition, the computer abandons obtaining current count value of the counter. Count values of the counter when the first keys group is closed can be obtained through following commands.

```
if (GetAsyncKeyState ('q')<0 && (na==0)) { QueryPerformanceCounter ( )}
if (GetAsyncKeyState ('e')<0 && (nb==0)) { QueryPerformanceCounter ( )}
if (GetAsyncKeyState ('u')<0 && (nc==0)) { QueryPerformanceCounter ( )}
if (GetAsyncKeyState ('o')<0 && (nn==0)) { QueryPerformanceCounter ( )}
```

That is, count values of the counter when the first power contacts group is closed can be obtained, among them, "na", "nb", "nc", and "nn" are the first auxiliary parameter, the second auxiliary parameter, the third auxiliary parameter, and the fourth auxiliary parameter, respectively.

Figure 4:
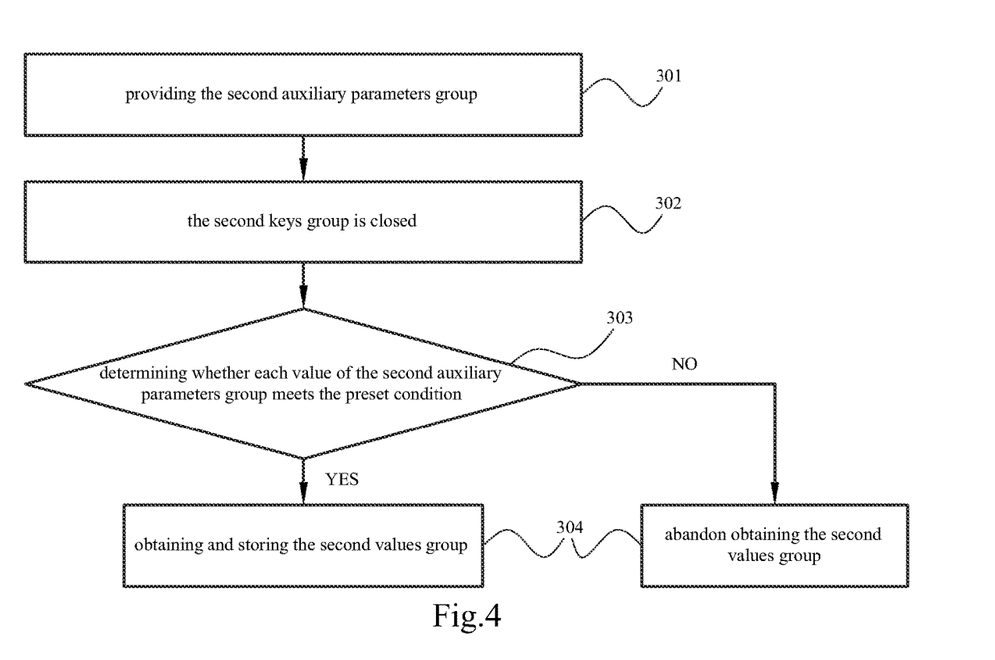
FIG. 4 is a flow chart of illustrative steps for obtaining and storing a second values group in accordance with an embodiment of the present invention.

FIG. 4 is a flow chart of illustrative steps for obtaining and storing the second values group, it is a method used to obtain and store the second values group of the counter of the computer when the second keys group is closed according to a value of a second auxiliary parameters group. As shown in FIG. 4, the method comprises following steps.

At step 301, providing the second auxiliary parameters group.

As an illustrative example, the dual power transfer switch switches the load side from the first power side to the second power side. The second auxiliary parameters group comprises a fifth auxiliary parameter, a sixth auxiliary parameter, a seventh auxiliary parameter, and an eighth auxiliary parameter. Initialize each auxiliary parameter in the second auxiliary parameters group to 0 in an early stage of collecting and measuring program, the second auxiliary parameters group is used to assist in execution of command for obtaining the second values group, a preset condition for obtaining the second values group is that each value of the second auxiliary parameters group is 0. Specifically, a command for obtaining the fifth value is executed once the fifth auxiliary parameter is 0, another command for obtaining the sixth value is executed once the sixth auxiliary parameter is 0, another command for obtaining the seventh value is executed once the seventh auxiliary parameter is 0, another command for obtaining the eighth value is executed once the eighth auxiliary parameter is 0.

At step 302, it is detected that the second keys group is pressed.

At step 303, it is determined whether each value of the second auxiliary parameters group meets the preset condition.

At step 304, if each value of the second auxiliary parameters group meets the preset condition, the computer obtains and stores the second values group; if any value of the second auxiliary parameters group does not meet the preset condition, the computer abandons obtaining the second values group.

When the second power contacts group of the dual power transfer switch is closed, i.e., fifth key W, sixth key R, seventh key I, and eighth key P are all closed. Determine whether the second auxiliary parameters group meets the preset condition. Since each auxiliary parameter in the second auxiliary parameters group has been initialized to 0, the second auxiliary parameters group meets the preset condition, the computer obtains count values of the counter at this time, and stores obtained count values in the second values group, then changes each auxiliary parameter of the second auxiliary parameters group from 0 to 1. Specially, obtain and store the fifth value when the fifth contacts group corresponding to fifth key W is closed according to a value of the fifth auxiliary parameter, and then change the value of the fifth auxiliary parameter from 0 to 1. Obtain and store the sixth value when the sixth contacts group corresponding to sixth key R is closed according to a value of the sixth auxiliary parameter, and then change the value of the sixth auxiliary parameter from 0 to 1. Obtain and store the seventh value when the seventh contacts group corresponding to sixth key I is closed according to a value of the seventh auxiliary parameter, and then change the value of the seventh auxiliary parameter from 0 to 1. Obtain and store the eighth value when the eighth contacts group corresponding to eighth key P is closed according to a value of the eighth auxiliary parameter, and then change the value of the eighth auxiliary parameter from 0 to 1. Since each auxiliary parameter of the second auxiliary parameters group is updated to 1 and no longer meets the preset condition for obtaining the second values group, the computer no longer obtains or stores the second values group. Therefore, current the second values group is a count value of the counter obtained by the computer at a moment when the second power contacts group is closed.

Although the second keys group continues to be closed, however, because each auxiliary parameter of the second auxiliary parameters group does not satisfy the preset condition for obtaining and storing the second values group, the computer abandons obtaining the second values group. Count values of the counter of the second keys group at a moment of closing can be obtained through following commands.

```
if (GetAsyncKeyState ('w')<0 && (ra==0)) { QueryPerformanceCounter ( ) ; ra++;}
if (GetAsyncKeyState ('r')<0 && (rb==0)) { QueryPerformanceCounter ( ) ; rb++;}
if (GetAsyncKeyState ('i')<0 && (rc==0)) { QueryPerformanceCounter ( ) ; rc++;}
if (GetAsyncKeyState ('p')<0 && (rn==0)) { QueryPerformanceCounter ( ) ; rn++;}
```

That is, count values of the counter at a moment when the second power contacts group is closed can be obtained, among them, "na", "nb", "nc", and "nn" are the fifth auxiliary parameter, the sixth auxiliary parameter, the seventh auxiliary parameter, and the eighth auxiliary parameter, respectively.

Figure 5:
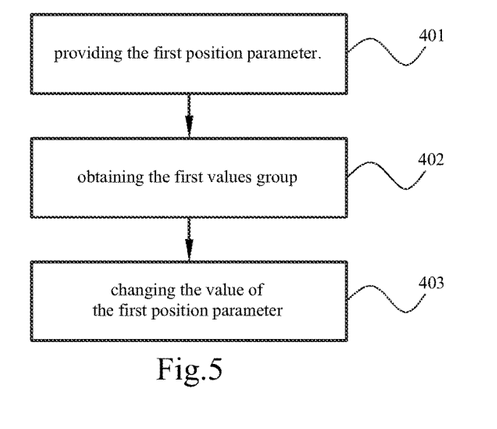
FIG. 5 is a flow chart of illustrative steps for changing a first position parameter in accordance with an embodiment of the present invention.

FIG. 5 is a flow chart of illustrative steps for changing a value of a first position parameter, it is a method used to change a value of the first position parameter after the computer obtains the first values group. As shown in FIG. 5, the method comprises following steps.

At step 401, providing the first position parameter.

As an illustrative example, initialize a value of the first position parameter to 0 in an early stage of collecting and measuring program. The first position parameter is used to assist in indicating a power information currently connected to the load side.

At step 402, obtaining the first values group.

At step 403, changing the value of the first position parameter.

The first values group having been obtained means that the first power contacts group is closed, it also means that current the load side is powered by the first power side, information of current working power can be displayed on screen through command "cout". Execution condition of a display command is that the first keys group is closed and the value of the first position parameter is 0. Since the first position parameter has been initialized to 0, the screen shows that the first power side connects to the load side after all keys in the first keys group are pressed, i.e., after the computer obtains all values of the first values group, then the value of the first position parameter is changed from 0 to 1. Since the value of the first position parameter at this time is not 0, the display command is no longer executed to ensure that only one power message is displayed in one switch process so as to avoid the power message reappearing on the entire screen.

Figure 6:
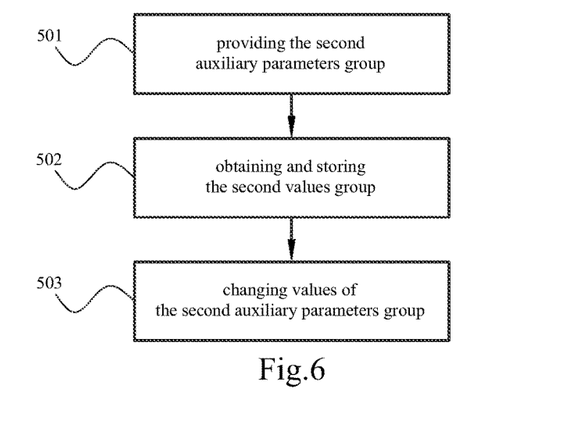
FIG. 6 is a flow chart of illustrative steps for changing a second auxiliary parameters group in accordance with an embodiment of the present invention.

FIG. 6 is a flow chart of illustrative steps for changing values of the second auxiliary parameters group, it is a method used to change values of the second auxiliary parameters group after the computer obtains and stores the second values group. As shown in FIG. 6, the method comprises following steps.

At step 501, providing the second auxiliary parameters group.

The second auxiliary parameters group is used as a basis for judging whether to obtain and store the second values group during a process of switching the dual power transfer switch from the first power side to the second power side.

At step 502, obtaining and storing the second values group.

The computer obtains and stores the second values group once the second power contacts group changes from opened state to closed state (i.e., the second keys group is closed) after the dual power switch is switched from the first power side to the second power side.

At step 503, changing values of the second auxiliary parameters group.

Values of the second auxiliary parameters group are changed after the second values group is obtained and stored. Since the dual power transfer switch switches the load side from the first power side to the second power side, a moment when the second values group is obtained and stored is a moment when the second keys group is closed. Therefore, after obtaining and storing the second values group, values of the second auxiliary parameters group are changed so that the preset condition for obtaining the second value group is not satisfied, thereby avoiding the second values group currently stored from being updated, it is ensured that values of the second values group are real and valid.

Figure 7:
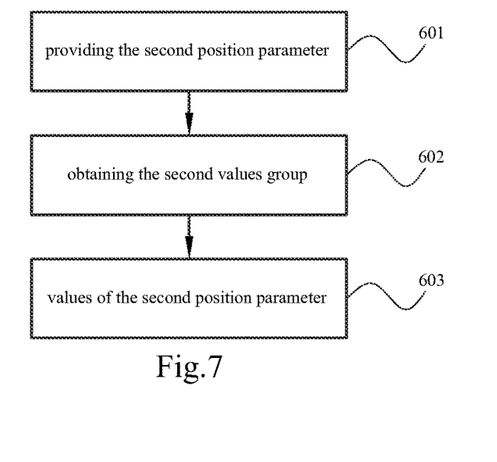
FIG. 7 is a flow chart of illustrative steps for changing a second position parameter in accordance with an embodiment of the present invention.

FIG. 7 is a flow chart of illustrative steps for changing a value of a second position parameter, it is a method used to change a value of the second position parameter after the computer obtains the second values group. As shown in FIG. 7, the method comprises following steps.

At step 601, providing the second position parameter.

As an illustrative example, initialize a value of the second position parameter to 0 in an early stage of collecting and measuring program. The second position parameter is used to assist in indicating a power information currently connected to the load side.

At step 602, obtaining the second values group.

At step 603, changing values of the second position parameter.

The second values group having been obtained means that the second power contacts group is closed, it also means that current the load side is powered by the second power side, information of current working power can be displayed on screen through command "cout". Since an initial value of the second position parameter is 0, the value of the second position parameter changes from 0 to 1 after the dual power transfer switch is switched from the first power side to the second power side (i.e., after the computer obtains the second values group.) Therefore execution condition of a display command is that the second keys group is closed and the value of the second position parameter is 1. Therefore the screen shows that the second power side connects to the load side after all keys in the second keys group are pressed, i.e., after the computer obtains all values of the second values group, then the value of the second position parameter is changed from 1 to 2. Since the value of the second position parameter at this time is not 1, the display command is no longer executed to ensure that only one power message is displayed in one switch process so as to avoid the power message reappearing on the entire screen.

Figure 8:
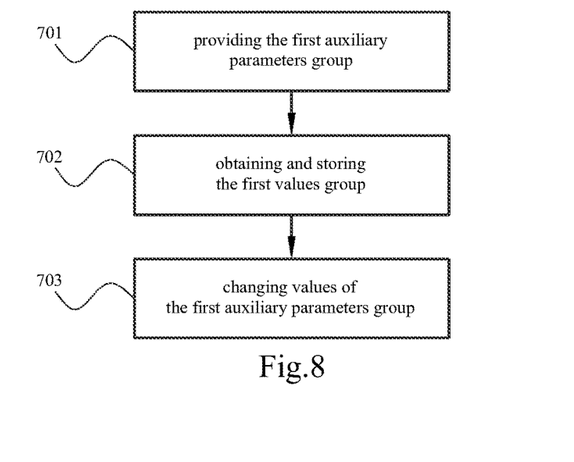
FIG. 8 is a flow chart of illustrative steps for changing a first auxiliary parameters group in accordance with an embodiment of the present invention.

FIG. 8 is a flow chart of illustrative steps for changing values of the first auxiliary parameters group, it is a method used to change values of the first auxiliary parameters group after the computer obtains and stores the first values group. As an illustrative example, the dual power transfer switch switches the load side from the second power side back to the first power side. As shown in FIG. 8, the method comprises following steps.

At step 701, providing the first auxiliary parameters group.

The first auxiliary parameters group is used as a basis for judging whether to obtain and store the first values group during a process of switching the dual power transfer switch from the second power side back to the first power side after switching from the first power side to the second power side.

At step 702, obtaining and storing the first values group.

The computer obtains and stores the first values group once the first power contacts group changes from opened state to closed state (i.e., the first keys group is closed) after the dual power switch is switched from the second power side back to the first power side.

At step 703, changing values of the first auxiliary parameters group.

Values of the first auxiliary parameters group are changed after the first values group is obtained and stored. Since the dual power transfer switch switches the load side from the second power side back to the first power side, a moment when the first values group is obtained and stored is a moment when the first keys group is closed. Therefore, after obtaining and storing the first values group, values of the first auxiliary parameters group are changed so that the preset condition for obtaining the first value group is not satisfied, thereby avoiding the first values group currently stored from being updated, it is ensured that values of the first values group are real and valid.

Figure 10:
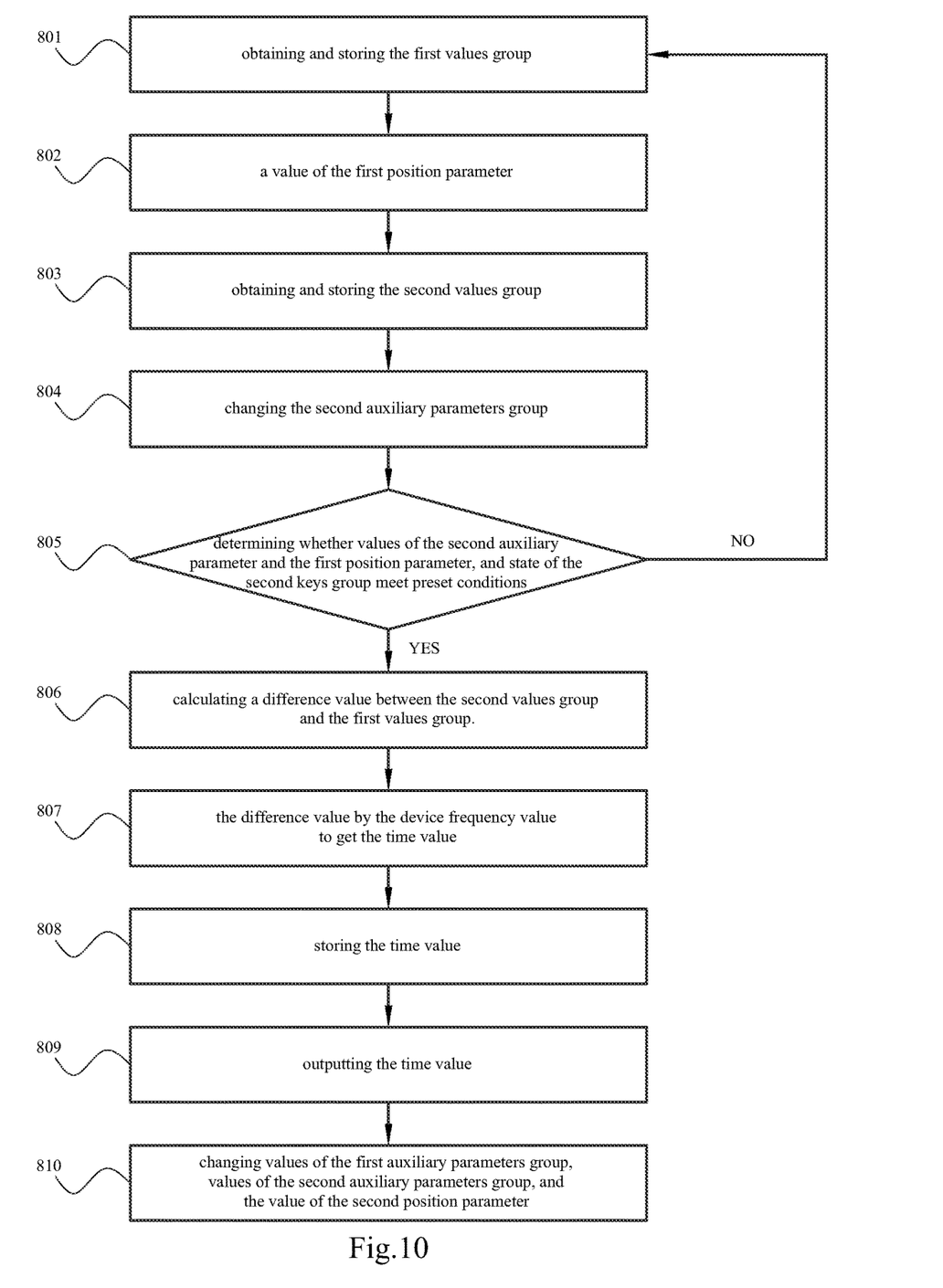
FIG. 10 is a flow chart of illustrative collecting and measuring method for conduct transition time of dual power transfer switch in accordance with an embodiment of the present invention.

FIG. 10 is a flow chart of illustrative collecting and measuring method for conduct transition time of dual power transfer switch, as shown in FIG. 10, the method is used to collect and measure a conduct transition time of dual power transfer switch. Take the dual power transfer switch as an example, collect and measure the conduct transition time of the dual power switch during a first half transition cycle, that is, when switching from the first power side to the second power side. The method comprises following steps.

At step 801, obtaining and storing the first values group.

The first power contacts group switches from closed state to opened state after the dual power transfer switch switches the load side from the first power side to the second power side, the first values group stored in the computer is a group of count values of the counter at a moment when the first power contacts group is opened.

At step 802, changing a value of the first position parameter.

The value of the first position parameter is changed after the first values group is stored to avoid the power message reappearing on the entire screen.

At step 803, obtaining and storing the second values group.

The second power contacts group switches from opened state to closed state after the dual power transfer switch switches the load side from the first power side to the second power side, the computer obtains and stores the second values group.

At step 804, changing the second auxiliary parameters group.

Values of the second auxiliary parameters group are changed after the second values group is stored so that values of the second auxiliary parameters group do not meet the preset condition for obtaining the second values group, therefore, the second values group stored is a group of count values of the counter at a moment when the second power contacts group is closed.

At step 805, determining whether values of the second auxiliary parameter and the first position parameter, and state of the second keys group meet preset conditions.

The preset conditions are as followed. Each value of all auxiliary parameters in the second auxiliary parameters group is 1, a value of the first position parameter is 1, and state of each key of the second keys group is closed. Specifically, the second keys group being closed indicates that the second power contacts group is currently closed; the first position parameter is 1, which indicates that the load side currently connecting to the second power side is shown on the screen; each value of all auxiliary parameters in the second auxiliary parameters group is 1, which indicates that the computer has obtained and stored count values of the counter at a moment when the second keys group is closed.

At step 806, calculating a difference value between the second values group and the first values group.

At step 807, dividing the difference value by the device frequency value to get the time value.

At step 808, storing the time value.

At step 809, outputting the time value.

The difference value between the second values group and the first values group is calculated when values of the second auxiliary parameters group, a value of the first position parameter, and a state of the second keys group satisfy the preset condition. The second values group obtained at a moment when the second power contacts group is closed minus the first values group obtained at a moment when the first power contacts group is opened to get the difference value, divide the difference value by the device frequency value to get the time value, this time value calibrates a time period from a moment when the first power contacts group switches from closed state to opened state to a moment when the second power contacts group switches from opened state to closed state. This time value truly and effectively reflects a time from a moment when a moving contact of the dual power transfer switch leaves a static contact of the first power side to a moment when the moving contact contacts another static contact of the second power side. Store the time value, and display the time value on the screen by command "cout".

At step 810, changing values of the first auxiliary parameters group, values of the second auxiliary parameters group, and the value of the second position parameter.

One transition cycle of the dual power transfer switch is that the load side switches from the first power side to the second power side and then from the second power side back to the first power side. In a first half transition cycle, the conduct transition time is a time period from a moment when the first power contacts group is opened to a moment when the second power contacts group is closed. In a second half transition cycle, the conduct transition time is a time period from a moment when the second power contacts group is opened to a moment when the first power contacts group is closed. Therefore, before entering a next half transition cycle, the auxiliary parameters group used to assist in obtaining the first values group and the second values group needs to be changed to meet the preset condition for obtaining the first values group and the second values group, and the second position parameter is changed to correctly indicate a power information currently connected to the load side.

Figure 11:
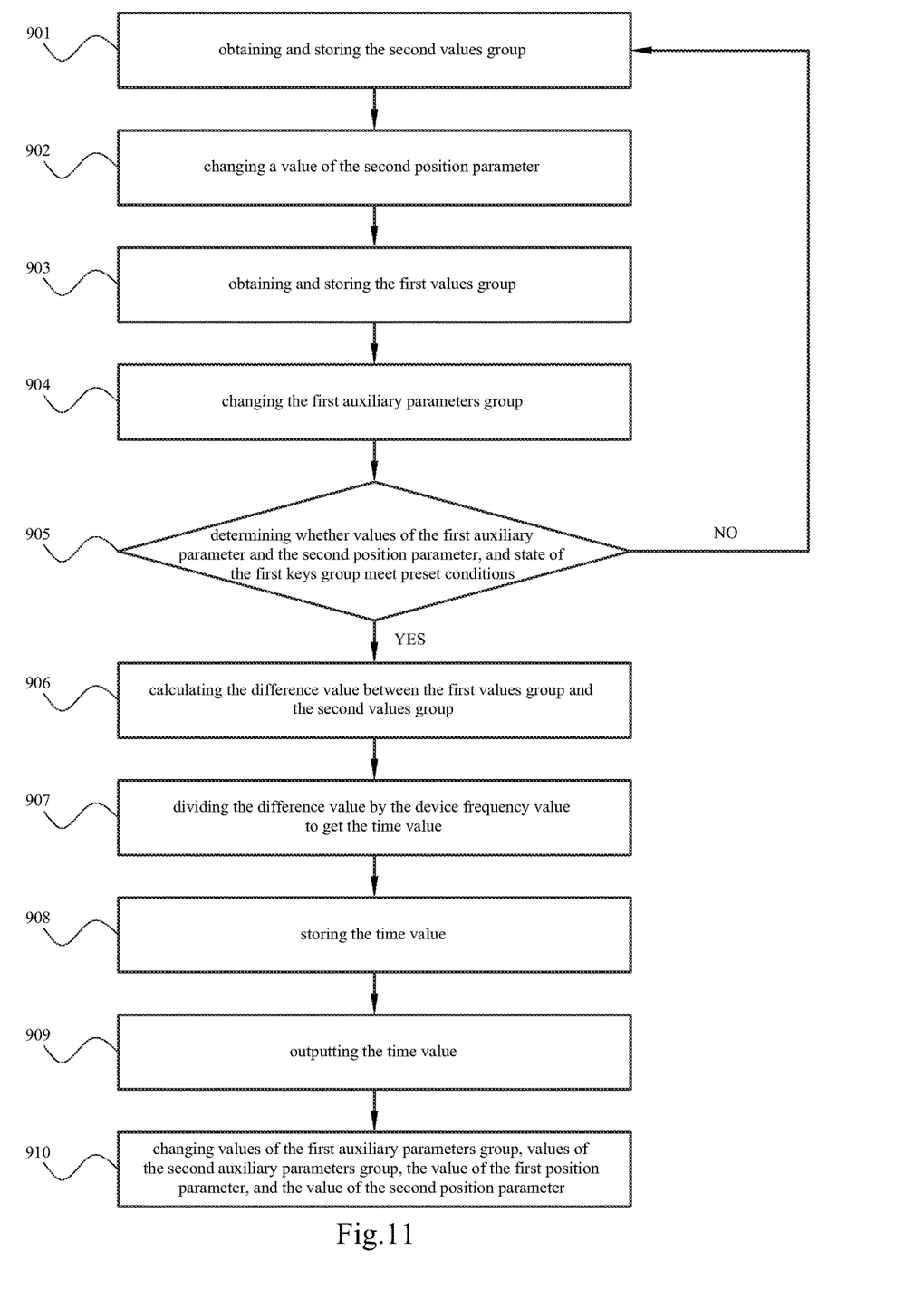
FIG. 11 is a flow chart of illustrative collecting and measuring method for conduct transition time of dual power transfer switch in accordance with an embodiment of the present invention.

FIG. 11 is a flow chart of illustrative collecting and measuring method for conduct transition time of dual power transfer switch, as shown in FIG. 11, the method is used to collect and measure a conduct transition time of dual power transfer switch. Take the dual power transfer switch as an example, collect and measure the conduct transition time of the dual power switch during the second half transition cycle, that is, when switching from the second power side back to the first power side. The method comprises following steps.

At step 901, obtaining and storing the second values group.

The second power contacts group switches from closed state to opened state after the dual power transfer switch switches the load side from the second power side back to the first power side, the second values group stored in the computer is a group of count values of the counter at a moment when the second power contacts group is opened.

At step 902, changing a value of the second position parameter.

The value of the second position parameter is changed after the second values group is stored to avoid the power message reappearing on the entire screen.

At step 903, obtaining and storing the first values group.

The first power contacts group switches from opened state to closed state after the dual power transfer switch switches the load side from the second power side back to the first power side, the computer obtains and stores the first values group.

At step 904, changing the first auxiliary parameters group.

Values of the first auxiliary parameters group are changed after the first values group is stored so that values of the first auxiliary parameters group do not meet the preset condition for obtaining the first values group, therefore, the first values group stored is a group of count values of the counter at a moment when the first power contacts group is closed.

At step 905, determining whether values of the first auxiliary parameter and the second position parameter, and state of the first keys group meet preset conditions.

The preset conditions are as followed. Each value of all auxiliary parameters in the first auxiliary parameters group is 2, a value of the second position parameter is 2, and state of each key of the first keys group is closed. Specifically, the first keys group being closed indicates that the first power contacts group is currently closed; the second position parameter is 2, which indicates that the load side currently connecting to the first power side is shown on the screen; each value of all auxiliary parameters in the first auxiliary parameters group is 2, which indicates that the computer has obtained and stored count values of the counter at a moment when the first keys group is closed.

At step 906, calculating the difference value between the first values group and the second values group.

At step 907, dividing the difference value by the device frequency value to get the time value.

At step 908, storing the time value.

At step 909, outputting the time value.

The difference value between the first values group and the second values group is calculated when values of the first auxiliary parameters group, the value of the second position parameter, and the state of the first keys group satisfy the preset condition. The first values group obtained at a moment when the first power contacts group is closed minus the second values group obtained at a moment when the second power contacts group is opened to get the difference vale, divide the difference value by the device frequency value to get the time value, this time value calibrates a time period from a moment when the second power contacts group switches from closed state to opened state to a moment when the first power contacts group switches from opened state to closed state. This time value truly and effectively reflects a time from a moment when a moving contact of the dual power transfer switch leaves a static contact of the second power side to a moment when the moving contact contacts another static contact of the first power side. Store the time value, and display the time value on the screen by command "cout".

At step 910, changing values of the first auxiliary parameters group, values of the second auxiliary parameters group, the value of the first position parameter, and the value of the second position parameter.

One transition cycle of the dual power transfer switch is that the load side switches from the first power side to the second power side and then from the second power side back to the first power side. In a first half transition cycle, the conduct transition time is a time period from a moment when the first power contacts group is opened to a moment when the second power contacts group is closed. In a second half transition cycle, the conduct transition time is a time period from a moment when the second power contacts group is opened to a moment when the first power contacts group is closed. Therefore, before entering a next half transition cycle, the auxiliary parameters group used to assist in obtaining the first values group and the second values group needs to be changed to meet the preset condition for obtaining the first values group and the second values group, and the second position parameter is changed to correctly indicate a power information currently connected to the load side. Method for changing parameter value includes but not limited to initialize the parameter value.

Collecting and measuring method disclosed by the embodiment not only collects a conduct transition time of a dual power transfer switch from a first power side to a second power side, but also continues to collect another conduct transition time of the dual power transfer switch from the second power side back to the first power side without changing wiring method between the dual power transfer switch terminal and the collecting apparatus. Therefore, the collecting and measuring method disclosed by the embodiment can continuously and uninterruptedly collect and measure conduct transition time of each pole in multiple transition cycles of dual power transfer switch so as to provide basic data for further judging influence of frequent operations on conduct transition time.

Figure 2:
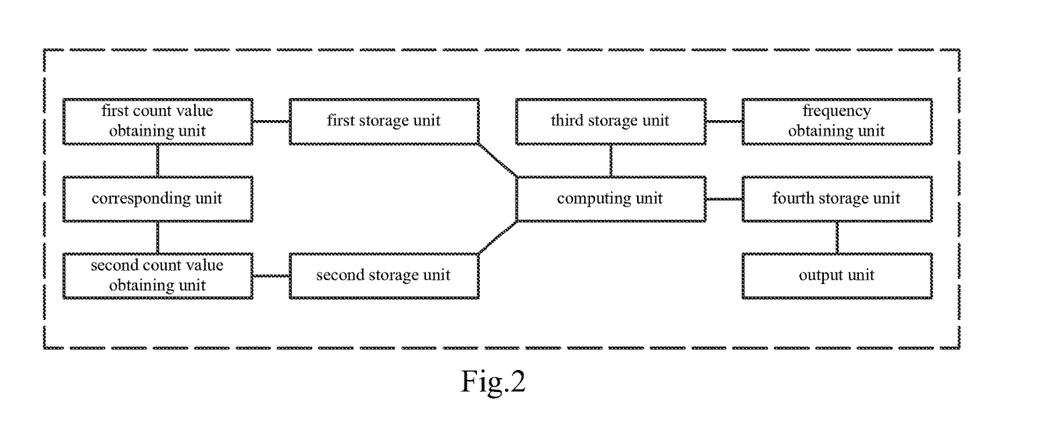
FIG. 2 is a block diagram of illustrative collecting and measuring apparatus for conduct transition time of dual power transfer switch in accordance with an embodiment of the present invention.

FIG. 2 is a block diagram of illustrative collecting and measuring apparatus for conduct transition time of dual power transfer switch, the collecting and measuring apparatus comprises a corresponding unit, a frequency obtaining unit, a first count value obtaining unit, a second count value obtaining unit, a first storage unit, a second storage unit, a third storage unit, a fourth storage unit, a computing unit, and an output unit.

Specially, the corresponding unit is used for corresponding a contacts group of the dual power transfer switch to a key of a computer keyboard, for corresponding a contacts group state to a key state, for corresponding the first keys group composed of multiple keys to the first power contacts group composed of multiple contacts groups of the first power side, and for corresponding the second keys group composed of another multiple keys to the second power contacts group composed of multiple contacts groups of the second power side.

The frequency obtaining unit is used for obtaining the device frequency value of the computer.

The first count value obtaining unit is used for obtaining the first values group of the counter of the computer when the first keys group is closed, each value of the first values group corresponding to a count value of the counter when a corresponding key of the first keys group is closed.

The second count value obtaining unit is used for obtaining the second values group of the counter of the computer when the second keys group is closed, each value of the second values group corresponding to a count value of the counter when a corresponding key of the second keys group is closed.

The first storage unit is used for storing the first values group.

The second storage unit is used for storing the second values group.

The third storage unit is used for storing the device frequency value of the computer.

The computing unit is used for calculating the difference value between two values of a corresponding pole in the second values group and the first values group, and for dividing the difference value by the device frequency value of the computer to get the time value, the time value is a conduct transition time value of a corresponding pole.

The fourth storage unit is used for storing the time value.

The output unit is used for outputting the time value on the screen.

Figure 9:
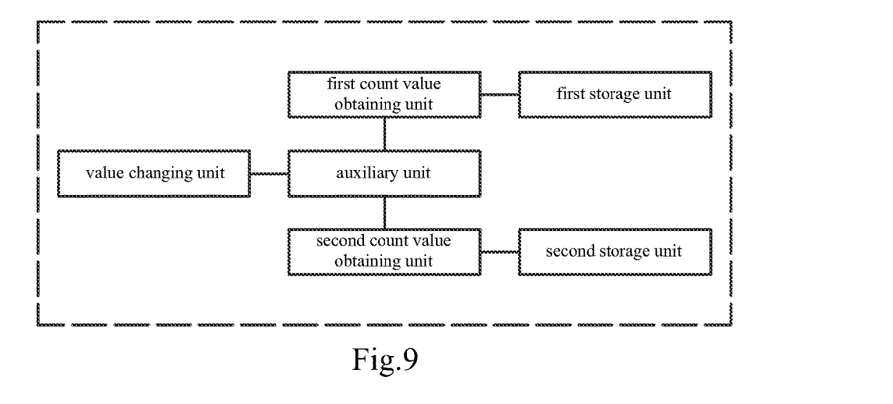
FIG. 9 is a block diagram of illustrative collecting and measuring apparatus for conduct transition time of dual power transfer switch in accordance with an embodiment of the present invention.

FIG. 9 is a block diagram of illustrative collecting and measuring apparatus for conduct transition time of dual power transfer switch, as shown in FIG. 9, the collecting and measuring apparatus further comprises an auxiliary unit, a position unit, and a value changing unit.

Specially, the auxiliary unit is used for providing the auxiliary parameter, the auxiliary parameter comprises the first auxiliary parameters group and the second auxiliary parameters group, the first auxiliary parameters group comprises the first auxiliary parameter, the second auxiliary parameter, the third auxiliary parameter, and the fourth auxiliary parameter. The second auxiliary parameters group comprises the fifth auxiliary parameter, the sixth auxiliary parameter, the seventh auxiliary parameter, and the eighth auxiliary parameter. The position unit is used for providing a position parameter, the position parameter comprises the first position parameter and the second position parameter. The value changing unit is used for changing values of parameters, the value changing unit comprises a first value changing unit, a second value changing unit, and a third value changing unit.

Specially, the first count value obtaining unit is used for obtaining and storing the first value when the first contacts group corresponding to a first key is closed according to a value of the first auxiliary parameter, obtaining and storing the second value when the second contacts group corresponding to a second key is closed according to a value of the second auxiliary parameter, obtaining and storing the third value when the third contacts group corresponding to a third key is closed according to a value of the third auxiliary parameter, and obtaining and storing the fourth value when the fourth contacts group corresponding to a fourth key is closed according to a value of the fourth auxiliary parameter.

Specially, the second count value obtaining unit is used for obtaining and storing the fifth value when the fifth contacts group corresponding to a fifth key is closed according to a value of the fifth auxiliary parameter, obtaining and storing the sixth value when the sixth contacts group corresponding to a sixth key is closed according to a value of the sixth auxiliary parameter, obtaining and storing the seventh value when the seventh contacts group corresponding to a seventh key is closed according to a value of the seventh auxiliary parameter, and obtaining and storing the eighth value when the eighth contacts group corresponding to an eighth key is closed according to a value of the eighth auxiliary parameter.

The first value changing unit is used to change a value of the first position parameter or values of the first auxiliary parameters group after obtaining and storing the first values group. The second value changing unit is used to change values of the second auxiliary parameters group or a value of the second position parameter after obtaining and storing the second values group. The third value changing unit is used to change values of the first auxiliary parameters group, values of the second auxiliary parameters group, and a value of the second position parameter according to values of the second auxiliary parameters group, a value of the first position parameter, and a state of each key of the second keys group. The computing unit calculates the difference value between two values of a corresponding pole in the second values group and the first values group when values of the second auxiliary parameters group, a value of the first position parameter, and state of each key of the second keys group meet the preset condition. Divide the difference value by the device frequency value of the computer to get the time value, the time value is a conduct transition time value in a process of switching the load side from the first power side to the second power side by a corresponding pole.

Optionally, the third value changing unit is also used to change values of the first auxiliary parameters group, values of the second auxiliary parameters group, a value of the first position parameter, and a value of the second position parameter according to values of the first auxiliary parameters group, the value of the second position parameter, and state of each key of the first keys group. The computing unit is also used to calculate the difference value between two values of a corresponding pole in the first values group and the second values group when values of the first auxiliary parameters group, the value of the second position parameter, and the state of the first keys group meet the preset condition. Divide the difference value by the device frequency value of the computer to get the time value, the time value is a conduct transition time value in a process of the corresponding pole switching the load side from the second power side to the first power side.

Optionally, the collecting and measuring apparatus also comprises the output unit for outputting the time value, and the output unit outputs the time value on the screen, as shown in Tables 2-4.

Tables 2-4 are recording tables for measuring conduct transition time values of dual power transfer switch using a collecting and measuring apparatus provided by an exemplary embodiment of the present application, these three recording tables record conduct transition time values corresponding to 12 consecutive transition cycles. "Power —A— is working!" means that the current load side is connected to the first power side, "Power —B— is working!" means that the current load side is connected to the second power side. "From A to B" means that the load side is switched from the first power side to the second power side, "From B to A" means that the load side is switched from the second power side back to the first power side. Values after "A:", "B:", "C:" and "N:" respectively represent conduct transition time values corresponding to phase A, phase B, phase C and phase N, a unit of value is microseconds. Value after "E:" represents an average value of conduct transition time values of phase A, phase B, phase C and phase N.

TABLE 1

Comparison relationship among line number, character, phase sequence and power side

| Line number | 1 | 3 | 5 | 7 | 2 | 4 | 6 | 14 |
|---|---|---|---|---|---|---|---|---|
| Character | Q | E | U | O | W | R | I | P |
| Phase sequence | A | B | C | N | A | B | C | N |
| Power side | | First power side | | | | Second power side | | |

TABLE 2

Recording table for measuring conduct transition time value

Power -A- is working!
From A to B--- NO.1 ----*---- 2020.3.28--18:8:22--72
A: 16061 us    B: 24107 us    C: 24080 us    N: 32065 us    E: 24078 us TABLE 2-continued Recording table for measuring conduct transition time value Power -B- is working!
From B to A--- NO.2 ----*---- 2020.3.28--18:8:23--382
A: 32034 us    B: 32215 us    C: 40265 us    N: 16139 us    E: 30163 us
Power -A- is working!
From A to B--- NO.3 ----*---- 2020.3.28--18:8:24--615
A: 32064 us    B: 32173 us    C: 24167 us    N: 40175 us    E: 32144 us
Power -B- is working!
From B to A--- NO.4 ----*---- 2020.3.28--18:8:25--722
A: 32080 us    B: 24111 us    C: 40063 us    N: 16114 us    E: 28092 us
Power -A- is working!
From A to B--- NO.5 ----*---- 2020.3.28--18:8:26--877
A: 24338 us    B: 32077 us    C: 16050 us    N: 48020 us    E: 30121 us
Power -B- is working!
From B to A--- NO.6 ----*---- 2020.3.28--18:8:27--875
A: 32073 us    B: 24084 us    C: 32054 us    N: 16059 us    E: 26067 us
Power -A- is working!
From A to B--- NO.7 ----*---- 2020.3.28--18:8:28--936
A: 32125 us    B: 16137 us    C: 40259 us    N: 32261 us    E: 30195 us

TABLE 3

Recording table for measuring conduct transition time value

Power -B- is working!
From B to A--- NO.8 ----*---- 2020.3.28--18:8:30--12
A: 40277 us    B: 24256 us    C: 40144 us    N: 24092 us    E: 32192 us
Power -A- is working!
From A to B--- NO.9 ----*---- 2020.3.28--18:8:30--995
A: 16199 us    B: 16197 us    C: 24187 us    N: 24189 us    E: 20193 us
Power -B- is working!
From B to A--- NO.10 ----*---- 2020.3.28--18:8:31--994
A: 40102 us    B: 16131 us    C: 40098 us    N: 16049 us    E: 28095 us
Power -A- is working!
From A to B--- NO.11 ----*---- 2020.3.28--18:8:33--86
A: 16165 us    B: 24121 us    C: 8114 us    N: 40136 us    E: 22134 us
Power -B- is working!
From B to A--- NO.12 ----*---- 2020.3.28--18:8:34--68
A: 32105 us    B: 24103 us    C: 32137 us    N: 16062 us    E: 26101 us
Power -A- is working!
From A to B--- NO.13 ----*---- 2020.3.28--18:8:35--129
A: 24088 us    B: 24083 us    C: 16182 us    N: 32106 us    E: 24114 us
Power -B- is working!
From B to A--- NO.14 ----*---- 2020.3.28--18:8:36--237
A: 40121 us    B: 24109 us    C: 40057 us    N: 16045 us    E: 30083 us
Power -A- is working!
From A to B--- NO.15 ----*---- 2020.3.28--18:8:37--173
A: 32113 us    B: 32083 us    C: 24131 us    N: 40069 us    E: 32099 us
Power -B- is working!
From B to A--- NO.16 ----*---- 2020.3.28--18:8:38--218
A: 24049 us    B: 16019 us    C: 24025 us    N: 16006 us    E: 20024 us

TABLE 4

Recording table for measuring conduct transition time value

Power -A- is working!
From A to B--- NO.17 ----*---- 2020.3.28--18:8:39--435
A: 16033 us    B: 32866 us    C: 24104 us    N: 48679 us    E: 30420 us
Power -B- is working!
From B to A--- NO.18 ----*---- 2020.3.28--18:8:40--402
A: 32197 us    B: 16154 us    C: 24320 us    N: 16362 us    E: 22258 us
Power -A- is working!
From A to B--- NO.19 ----*---- 2020.3.28--18:8:41--556
A: 16351 us    B: 16353 us    C: 24183 us    N: 24179 us    E: 20266 us
Power -B- is working!
From B to A--- NO.20 ----*---- 2020.3.28--18:8:42--555
A: 32253 us    B: 16034 us    C: 32258 us    N: 24261 us    E: 26201 us
Power -A- is working!
From A to B--- NO.21 ----*---- 2020.3.28--18:8:43--600
A: 32123 us    B: 32593 us    C: 24088 us    N: 40597 us    E: 32350 us
Power -B- is working!
From B to A--- NO.22 ----*---- 2020.3.28--18:8:44--739
A: 32117 us    B: 16108 us    C: 32135 us    N: 8127 us    E: 22121 us TABLE 4-continued Recording table for measuring conduct transition time value Power -A- is working!
From A to B--- NO.23 ----*---- 2020.3.28--18:8:45--815
A: 16404 us    B: 24053 us    C: 24424 us    N: 24182 us    E: 22265 us
Power -B- is working!
From B to A--- NO.24 ----*---- 2020.3.28--18:8:46--860
A: 48292 us    B: 16050 us    C: 40285 us    N: 32161 us    E: 34197 us

The invention claimed is:

1. A collecting and measuring method for conduct transition time of dual power transfer switch, comprising:
    corresponding a contacts group of a dual power transfer switch to a key of a computer keyboard;
    corresponding a contacts group state to a key state;
    corresponding a first keys group composed of multiple keys to a first power contacts group composed of multiple contacts groups of a first power side;
    corresponding a second keys group composed of another multiple keys to a second power contacts group composed of multiple contacts groups of a second power side;
    obtaining a device frequency value of a computer;
    obtaining and storing a first values group of a counter of the computer when the first keys group is closed, each value of the first values group corresponding to a count value of the counter when a corresponding key of the first keys group is closed;
    obtaining and storing a second values group of the counter of the computer when the second keys group is closed, each value of the second values group corresponding to a count value of the counter when a corresponding key of the second keys group is closed;
    calculating a difference value between two values of a corresponding pole in the second values group and the first values group;
    dividing the difference value by the device frequency value of the computer to get a time value; and
    storing the time value, the time value being a conduct transition time value of a corresponding pole.

2. The collecting and measuring method for conduct transition time of dual power transfer switch according to claim 1, further comprising:
    providing a first auxiliary parameters group, a second auxiliary parameters group, a first position parameter, and a second position parameter;
    obtaining and storing the first values group of the counter of the computer when the first keys group is closed according to values of the first auxiliary parameters group;
    changing the first position parameter or changing the first auxiliary parameters group after storing the first values group;
    obtaining and storing the second values group of the counter of the computer when the second keys group is closed according to the second auxiliary parameters group; and
    changing the second position parameter or changing the second auxiliary parameters group after storing the second values group.

3. The collecting and measuring method for conduct transition time of dual power transfer switch according to claim 2, further comprising:
    calculating the difference value between two values of a corresponding pole in the second values group and the first values group when values of the second auxiliary parameters group, a value of the first position parameter, and a state of the second keys group meet preset conditions;
    dividing the difference value by the device frequency value of the computer to get the time value;
    storing the time value, the time value being the conduct transition time value of the corresponding pole; and
    changing values of first auxiliary parameters group, values of the second auxiliary parameters group, and a value of the second position parameter according to the values of the second auxiliary parameters group, a value of the first position parameter, and the state of the second keys group.

4. The collecting and measuring method for conduct transition time of dual power transfer switch according to claim 3, further comprising:
    calculating the difference value between two values of a corresponding pole in the first values group and the second values group when values of the first auxiliary parameters group, the value of the second position parameter, and a state of the first keys group meet preset conditions;
    dividing the difference value by the device frequency value of the computer to get the time value;
    storing the time value, the time value being the conduct transition time value of the corresponding pole; and
    changing values of the first auxiliary parameters group, values of the second auxiliary parameters group, the value of the first position parameter, and the value of the second position parameter according to values of the first auxiliary parameters group, the value of the second position parameter, and the state of the first keys group.

5. The collecting and measuring method for conduct transition time of dual power transfer switch according to claim 4, wherein:
    the first keys group comprises a first key, a second key, a third key, and a fourth key;
    the second keys group comprises a fifth key, a sixth key, a seventh key, and an eighth key;
    the first power contacts group comprises a first contacts group, a second contacts group, a third contacts group, and a fourth contacts group;
    the second power contacts group comprises a fifth contacts group, a sixth contacts group, a seventh contacts group, and an eighth contacts group;
    the first values group comprises a first value, a second value, a third value, and a fourth value;
    the second values group comprises a fifth value, a sixth value, a seventh value, and an eighth value;
    the first auxiliary parameters group comprises a first auxiliary parameter, a second auxiliary parameter, a third auxiliary parameter, and a fourth auxiliary parameter;
    the second auxiliary parameters group comprises a fifth auxiliary parameter, a sixth auxiliary parameter, a seventh auxiliary parameter, and an eighth auxiliary parameter;
    a count value obtained and stored according to a value of the first auxiliary parameter when the first contacts group corresponding to the first key is closed is a first value;
    a count value obtained and stored according to a value of the second auxiliary parameter when the second contacts group corresponding to the second key is closed is a second value;

a count value obtained and stored according to a value of the third auxiliary parameter when the third contacts group corresponding to the third key is closed is a third value;
a count value obtained and stored according to a value of the fourth auxiliary parameter when the fourth contacts group corresponding to the fourth key is closed is a fourth value;
a count value obtained and stored according to a value of the fifth auxiliary parameter when the fifth contacts group corresponding to the fifth key is closed is a fifth value;
a count value obtained and stored according to a value of the sixth auxiliary parameter when the sixth contacts group corresponding to the sixth key is closed is a sixth value;
a count value obtained and stored according to a value of the seventh auxiliary parameter when the seventh contacts group corresponding to the seventh key is closed is a seventh value;
a count value obtained and stored according to a value of the eighth auxiliary parameter when the eighth contacts group corresponding to the eighth key is closed is an eighth value;
the first contacts group and the fifth contacts group correspond to a same pole of the dual power transfer switch;
the second contacts group and the sixth contacts group correspond to a same pole of the dual power transfer switch;
the third contacts group and the seventh contacts group correspond to a same pole of the dual power transfer switch; and
the fourth contacts group and the eighth contacts group correspond to a same pole of the dual power transfer switch.

6. A collecting and measuring apparatus, comprising:
a corresponding unit for corresponding a contacts group of a dual power transfer switch to a key of a computer keyboard, for corresponding a contacts group state to a key state, for corresponding a first keys group composed of multiple keys to a first power contacts group composed of multiple contacts groups of a first power side, and for corresponding a second keys group composed of another multiple keys to a second power contacts group composed of multiple contacts groups of a second power side;
a frequency obtaining unit for obtaining a device frequency value of the computer;
a first count value obtaining unit for obtaining a first values group of a counter of the computer when the first keys group is closed, each value of the first values group corresponding to a count value of the counter when a corresponding key of the first keys group is closed;
a second count value obtaining unit for obtaining a second values group of the counter of the computer when the second keys group is closed, each value of the second values group corresponding to a count value of the counter when a corresponding key of the second keys group is closed;
a first storage unit for storing the first values group;
a second storage unit for storing the second values group;
a third storage unit for storing the device frequency value of the computer;
a computing unit for calculating a difference value between two values of a corresponding pole in the second values group and the first values group, and for dividing the difference value by the device frequency value of the computer to get a time value, the time value being a conduct transition time value of a corresponding pole; and
a fourth storage unit for storing the time value.

7. The collecting and measuring apparatus according to claim 6, comprising:
an auxiliary unit for providing a first auxiliary parameters group, and a second auxiliary parameters group; the first count value obtaining unit obtaining the first values group of the counter of the computer according to values of the first auxiliary parameters group when the first keys group is closed, the second count value obtaining unit obtaining the second values group of the counter of the computer according to values of the second auxiliary parameters group when the second keys group is closed;
a position unit for providing a first position parameter, and a second position parameter;
a first value changing unit for changing a value of the first position parameter or changing values of the first auxiliary parameters group after obtaining and storing the first values group;
a second value changing unit for changing values of the second auxiliary parameters group or changing a value of the second position parameter after obtaining and storing the second values group; and
a third value changing unit for changing values of the first auxiliary parameters group, values of the second auxiliary parameters group, and a value of the second position parameter according to values of the second auxiliary parameters group, a value of the first position parameter, and a state of the second keys group;
wherein the computing unit calculates the difference value between two values of a corresponding pole in the second values group and the first values group when values of the second auxiliary parameters group, the value of the first position parameter, and the state of the second keys group meet preset conditions, then divides the difference value by the device frequency value of the computer to get the time value, then stores the time value, which is the conduct transition time value of the corresponding pole.

8. The collecting and measuring apparatus according to claim 7, wherein:
the third value changing unit is further for changing values of the first auxiliary parameters group, values of the second auxiliary parameters group, the value of the first position parameter, and the value of the second position parameter according to values of the first auxiliary parameters group, the value of the second position parameter, and state of each key of the first keys group;
the computing unit is further for calculating the difference value between two values of a corresponding pole in the first values group and the second values group when values of the first auxiliary parameters group, the value of the second position parameter, and the state of the first keys group meet preset conditions, and for dividing the difference value by the device frequency value of the computer to get the time value; and
the computer stores the time value that is the conduct transition time value of the corresponding pole.

9. The collecting and measuring apparatus according to claim 8, wherein:

the first keys group comprises a first key, a second key, a third key, and a fourth key;

the second keys group comprises a fifth key, a sixth key, a seventh key, and an eighth key;

the first power contacts group comprises a first contacts group, a second contacts group, a third contacts group, and a fourth contacts group;

the second power contacts group comprises a fifth contacts group, a sixth contacts group, a seventh contacts group, and an eighth contacts group;

the first contacts group and the fifth contacts group correspond to a same pole of the dual power transfer switch;

the second contacts group and the sixth contacts group correspond to a same pole of the dual power transfer switch;

the third contacts group and the seventh contacts group correspond to a same pole of the dual power transfer switch;

the fourth contacts group and the eighth contacts group correspond to a same pole of the dual power transfer switch;

the first values group comprises a first value, a second value, a third value, and a fourth value;

the second values group comprises a fifth value, a sixth value, a seventh value, and an eighth value;

the first auxiliary parameters group comprises a first auxiliary parameter, a second auxiliary parameter, a third auxiliary parameter, and a fourth auxiliary parameter;

the second auxiliary parameters group comprises a fifth auxiliary parameter, a sixth auxiliary parameter, a seventh auxiliary parameter, and an eighth auxiliary parameter;

the first count value obtaining unit is for:
  obtaining and storing the first value when the first contacts group corresponding to first key is closed according to a value of the first auxiliary parameter;
  obtaining and storing the second value when the second contacts group corresponding to first key is closed according to a value of the second auxiliary parameter;
  obtaining and storing the third value when the third contacts group corresponding to first key is closed according to a value of the third auxiliary parameter; and
  obtaining and storing the fourth value when the fourth contacts group corresponding to first key is closed according to a value of the fourth auxiliary parameter; and the second count value obtaining unit is for:
  obtaining and storing the fifth value when the fifth contacts group corresponding to fifth key is closed according to a value of the fifth auxiliary parameter;
  obtaining and storing the sixth value when the sixth contacts group corresponding to sixth key is closed according to a value of the sixth auxiliary parameter;
  obtaining and storing the seventh value when the seventh contacts group corresponding to seventh key is closed according to a value of the seventh auxiliary parameter; and
  obtaining and storing the eighth value when the eighth contacts group corresponding to eighth key is closed according to a value of the eighth auxiliary parameter.

* * * * *